United States Patent
Hirayama et al.

[11] Patent Number: 5,982,015
[45] Date of Patent: Nov. 9, 1999

[54] HIGH BREAKDOWN VOLTAGE SEMICONDUCTOR DEVICE

[75] Inventors: Keizo Hirayama, Ichikawa; Hideyuki Funaki, Tokyo; Fumito Suzuki, Kawasaki; Akio Nakagawa, Yokohama, all of Japan

[73] Assignee: Kabushiki Kaisha Toshiba, Kawasaki, Japan

[21] Appl. No.: 09/251,489

[22] Filed: Feb. 17, 1999

[30] Foreign Application Priority Data

Feb. 18, 1998 [JP] Japan .................................. 10-036251

[51] Int. Cl.[6] .......................... H01L 27/095; H01L 29/47; H01L 29/812; H01L 31/07
[52] U.S. Cl. ......................... 257/483; 257/476; 257/488; 257/491; 257/928
[58] Field of Search ..................................... 257/476, 480, 257/481, 483, 488, 489, 491, 655, 928

[56] References Cited

U.S. PATENT DOCUMENTS

| | | |
|---|---|---|
| 5,162,876 | 11/1992 | Kitagawa et al. . |
| 5,523,610 | 6/1996 | Kudo et al. ............................. 257/443 |
| 5,640,040 | 6/1997 | Nakagawa et al. ...................... 257/487 |

OTHER PUBLICATIONS

M. Mehrotra, et al., "Comparison of High Voltage Power Rectifier Structures", IEEE, 5th International Symposium on Power Semiconductor Devices and ICs, (1993), pp. 199–204.

H. Funaki, et al., "Lateral SOI Diode Design Optimization for High Ruggedness and Low Temperature Dependence of Reverse Recovery Characteristics", Proceedings of 1998 International Symposium on Power Semiconductor Devices & ICs, (1998), pp. 33–36.

*Primary Examiner*—Ngân V. Ngô
*Attorney, Agent, or Firm*—Oblon, Spivak, McClelland, Maier & Neustadt, P. C.

[57] ABSTRACT

Disclosed is a high breakdown voltage semiconductor device comprising a semiconductor substrate, an active layer consisting of a high resistivity semiconductor layer of a first conductivity type formed on the substrate with an insulating layer interposed therebetween, a first impurity region of the first conductivity type formed within the active layer, a second impurity region of a second conductivity type formed within the active layer, a third impurity region of the second conductivity type formed within the second impurity region and having a high impurity concentration, a first electrode being in ohmic contact with the first impurity region and the fourth impurity region, and a second electrode being in Schottky contact with the second impurity region and in ohmic contact with the third impurity region.

18 Claims, 14 Drawing Sheets

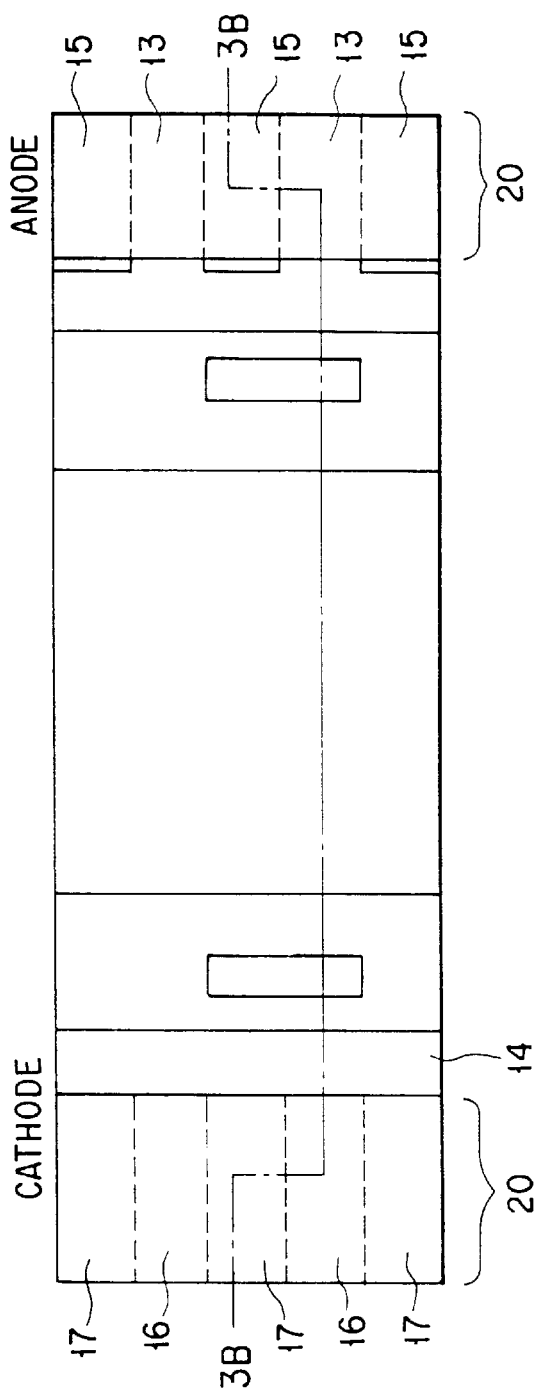
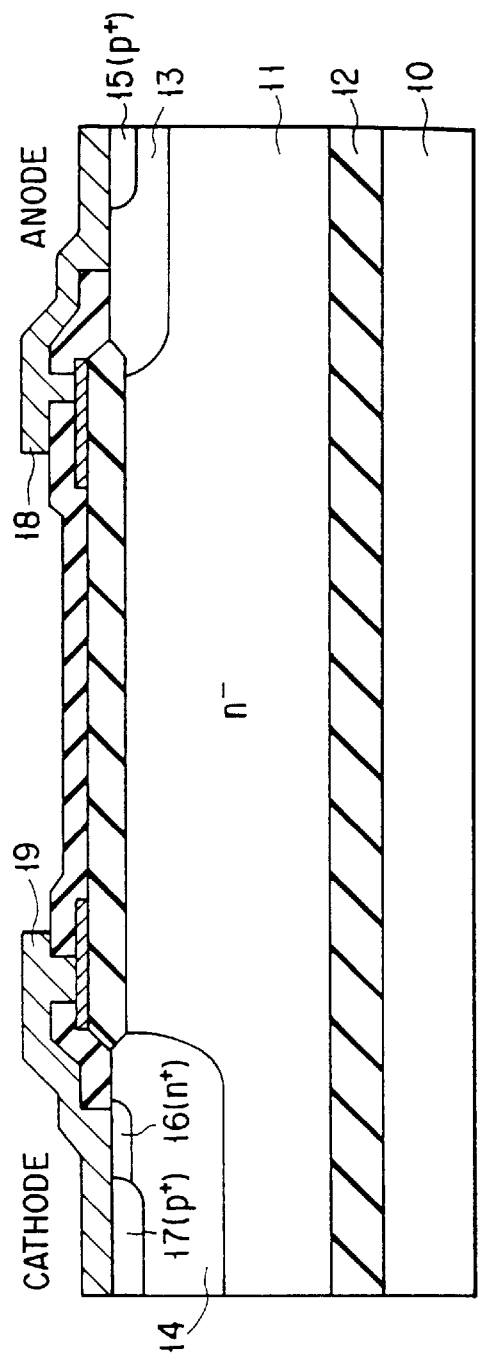
FIG. 3A
FIG. 3B

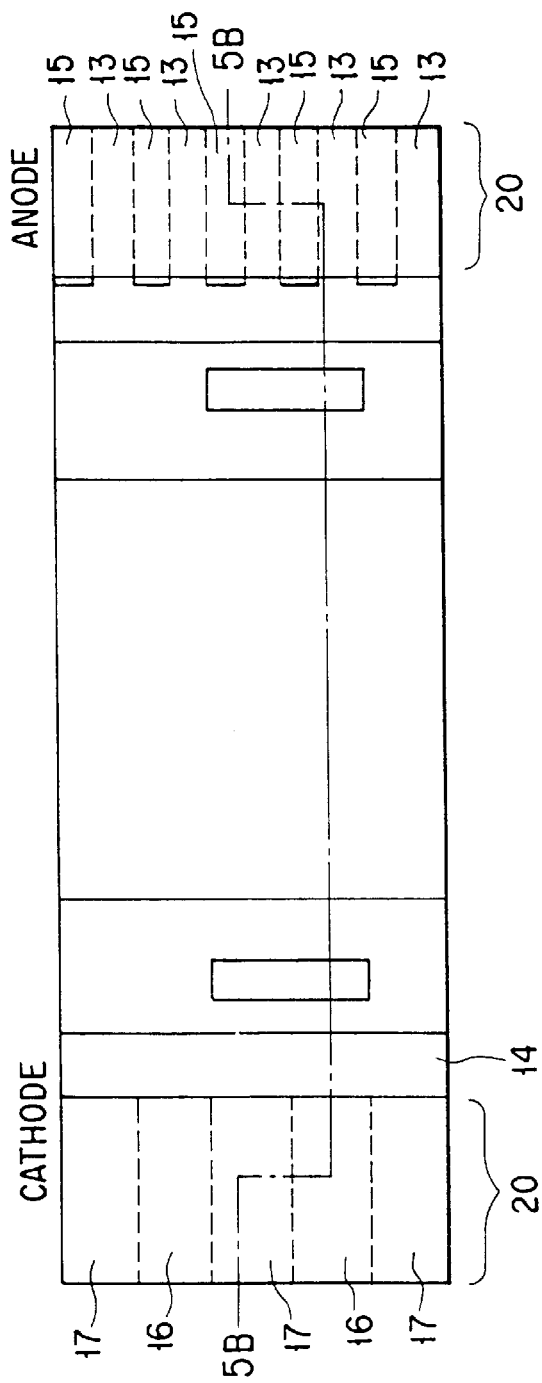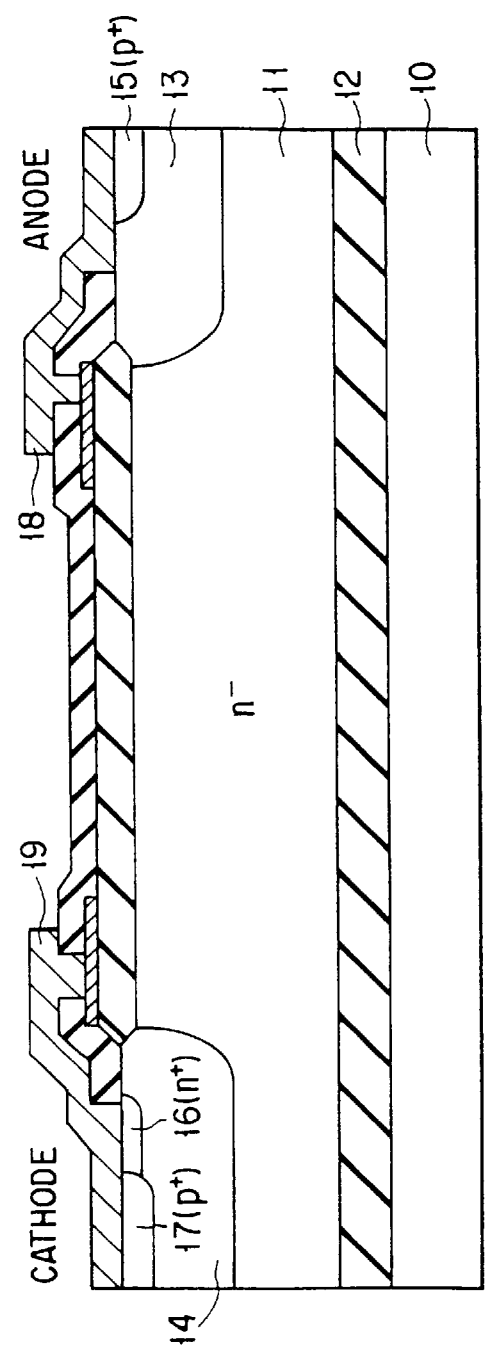
FIG. 5A
FIG. 5B

HIGH BREAKDOWN VOLTAGE SEMICONDUCTOR DEVICE

BACKGROUND OF THE INVENTION

The present invention relates to a high breakdown voltage semiconductor device having a dielectric isolation structure, particularly, a high breakdown voltage semiconductor device dielectric isolation type substrate.

FIG. 1 is a cross sectional view showing a conventional lateral diode using a dielectric isolation type substrate. As shown in the drawing, a dielectric isolation type substrate is prepared by stacking a semiconductor substrate 1 and an n-type semiconductor substrate 2 of a high resistivity one upon the other with an insulating film 3 interposed therebetween. A p-type anode region 4 and an n-type cathode region 5 are formed in a surface region of the n-type semiconductor substrate 2 of the dielectric isolation type substrate. Also, an $n^+$-type impurity region 6 and a $p^+$-type impurity region 7 are formed selectively on each of the anode region 4 and the cathode region 5. Further, an anode electrode 8 is formed in ohmic contact with the surface of each of the $n^+$-type impurity region 6 and the $p^+$-type impurity region 7 within the anode region 4. Likewise, a cathode electrode 9 is formed in ohmic contact with the surface of each of the $n^+$-type impurity region 6 and the $p^+$-type impurity region 7 within the cathode region 5.

Where the semiconductor substrate 2 has a thickness of 15 μm in the lateral type diode of the construction shown in FIG. 1, a reverse recovery time $t_{rr}$ is not longer than 0.18 μsec ($t_{rr} \leq 0.18$ μsec), supporting that the reverse recovery can be achieved at a high speed. However, a maximum reverse recovery current $I_{MAX}$ is not larger than 0.5A ($I_{MAX} \leq 0.5$A), supporting that the maximum reverse recovery current $I_{MAX}$ is low so as to allow the lateral diode to be destroyed easily.

As described above, the lateral diode using a conventional dielectric isolation type substrate is defective in that a parasitic thyristor is formed by the presence of the $n^+$-type impurity region. 6. The parasitic thyristor thus formed is latched up so as to lower the maximum reverse recovery current $I_{MAX}$ so as to allow the lateral diode to be destroyed easily

BRIEF SUMMARY OF THE INVENTION

An object of the present invention is to provide a high breakdown voltage semiconductor device using a dielectric isolation type substrate, the semiconductor device having a large maximum reverse recovery current $I_{MAX}$ to so as to allow the semiconductor device to be unlikely to be destroyed.

According to an aspect of the present invention, there is provided a high breakdown voltage semiconductor device comprising a semiconductor substrate, an active layer consisting essentially of a high resistivity semiconductor layer of a first conductivity type formed on the substrate with an insulating layer interposed therebetween, a first impurity region of the first conductivity type formed within the active layer, a second impurity region of a second conductivity type formed within the active layer, a third impurity region of the second conductivity type formed within the second impurity region and having an impurity concentration higher than that of the second impurity region, a first electrode being in ohmic contact with the first impurity region, and a second electrode being in Schottky contact with the second impurity region and in ohmic contact with the third impurity region.

According to another aspect of the present invention, there is provided a high breakdown voltage semiconductor device comprising a semiconductor substrate, an active layer consisting essentially of a high resistivity semiconductor layer of a first conductivity type formed on the substrate with an insulating layer interposed therebetween, a first impurity region of the first conductivity type formed within the active layer, a second impurity region of a second conductivity type formed within the active layer, a third impurity region of the second conductivity type formed within the second impurity region and having an impurity concentration higher than that in the second impurity region, a first electrode being in contact with the first impurity region, and a second electrode being in contact with the second impurity region and the third impurity region, wherein an impurity concentration in a surface of the second impurity region is not higher than $1.0 \times 10^{18}$ cm$^{-3}$.

According to still another aspect of the present invention, there is provided a high breakdown voltage semiconductor device comprising a semiconductor substrate, an active layer consisting of a high resistivity semiconductor layer of a first conductivity type formed on the substrate with an insulating layer interposed therebetween, a first impurity region of the first conductivity type formed within the active layer, a second impurity region of a second conductivity type formed within the active layer, a first electrode being in contact with the first impurity region, and a second electrode being in contact with each of the second impurity region, wherein an impurity concentration in a surface of the second impurity region is higher than $1.0 \times 10^{18}$ cm$^{-3}$ and not higher than $1.0 \times 10^{19}$ cm$^{-3}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3A is a plan view showing a lateral diode according to a modification of the present invention;

FIG. 3B is a cross sectional view along line 3B—3B shown in FIG. 3A;

FIG. 5A is a plan view showing a lateral diode according to another modification of the present invention;

FIG. 5B is a cross sectional view along line 5B—5B shown in FIG. 5A;

DETAILED DESCRIPTION OF THE INVENTION

Figure 1:
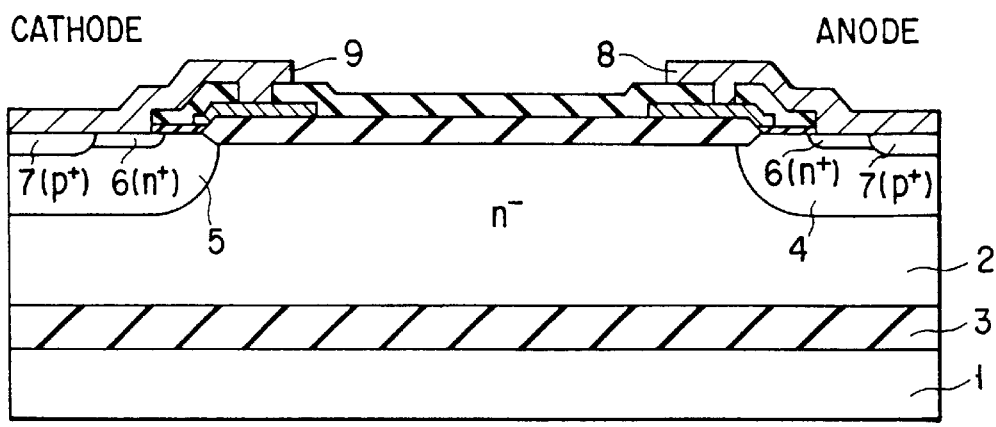
FIG. 1 is a cross sectional view showing a conventional lateral diode.

The high breakdown voltage semiconductor device according to a first embodiment of the present invention is featured in that a first electrode is in ohmic contact with a first impurity region, and a second electrode is in Schottky contact with a second impurity region and in ohmic contact with a third impurity region, or an impurity concentration in a surface region of the second impurity region is not higher than $1.0 \times 10^{18}$ cm$^{-3}$.

The term "Schottky contact" used herein means a contact between a metal and a semiconductor having an impurity concentration not higher than $1.0 \times 10^{18}$ cm$^{-3}$. On the other hand, the term "ohmic contact" used herein means a contact between a metal and a semiconductor having an impurity concentration not lower than $1.0 \times 10^{19}$ cm$^{-3}$.

It should be noted that, where an impurity region of a first conductivity type is not formed in the second impurity region, a parasitic thyristor is not formed because the second impurity region is in Schottky contact with the second electrode or the impurity concentration in a surface region of the second impurity region is not higher than $1.0 \times 10^{18}$ cm$^{-3}$. As a result, it is impossible for a parasitic thyristor to be latched up so as to prevent a maximum reverse recovery current $I_{MAX}$ from being lowered.

Thus, according to the first embodiment of the present invention, there is provides a high breakdown voltage semiconductor device, using a dielectric isolation type substrate, having a high maximum reverse recovery current $I_{MAX}$ and being unlikely to be destroyed.

Where a fourth impurity region and a contact hole are not formed in an end portion of the first impurity region, carriers are likely to be accumulated in the end portion of the first impurity region, with the result that an impact ionization takes place even under an intermediate voltage in injecting the carriers in a high concentration. It follows that it may be difficult to obtain a high breakdown voltage.

To overcome the above-noted difficulty, it is desirable for the fourth and fifth impurity regions to be alternately arranged in a radial configuration in a bent portion at the end of the first impurity region. Also, it is possible to form a plurality of third impurity regions of a second conductivity type having a high impurity concentration within the second impurity region such that these third impurity regions are positioned a predetermined distance apart from each other at the end portion of the second impurity region and form a radial configuration. These particular constructions make it possible to suppress the carrier injection into the end portion of the second impurity region.

In the high breakdown voltage semiconductor device according to the first embodiment of the present invention described above, it is possible to obtain a predetermined value or more of maximum reverse recovery current resistance $I_{MAX}$ by setting the impurity concentration in a surface region of the second impurity region at $1.0 \times 10^{18}$ cm$^{-3}$ or less. It is also possible to obtain a predetermined value or more of maximum reverse recovery current $I_{MAX}$ by setting the diffusion depth in the second impurity region at 2 μm or more.

In a high breakdown voltage semiconductor device according to the second embodiment of the present invention, a third impurity region formed within the second impurity region is defined to have an impurity concentration exceeding $1.0 \times 10^{18}$ cm$^{-3}$ and less than $1.0 \times 10^{19}$ cm$^{-3}$. In the semiconductor device of the particular construction, an impurity region of the first conductivity type is not formed within the second impurity region. Also, the fifth impurity region is in transition contact, which is intermediate between the Schottky contact and the ohmic contact, with the second electrode, with the result that a parasitic thyristor is not formed. Naturally, a parasitic thyristor is not latched up to lower the maximum reverse recovery current $I_{MAX}$. It follows that the second embodiment of the present invention makes it possible to obtain a high breakdown voltage semiconductor device, using a dielectric isolation type substrate and having a high maximum reverse recovery current $I_{MAX}$ to make the device unlikely to be destroyed.

In the high breakdown voltage semiconductor device according to the second embodiment of the present invention, the impurity concentration of the third impurity region is set at a low level falling within a transition range, making it possible to suppress the hole injection from the third impurity region. It should also be noted that the insulating film positioned above the pn junction portion has a large thickness, making it possible to moderate the electric field generated by the concentration of the current $I_A$ in the surface region in the step of sweeping out carriers. It follows that it is possible to increase the maximum reverse recovery current.

In the lateral diode according to the third embodiment of the present invention, the impurity concentration of the second region is set at a low level falling within a transition range, making it possible to suppress the hole injection from the second region in the anode. It should also be noted that the second impurity region is diffused deep, making it possible to prevent current $I_A$ from being concentrated in the surface region in the step of sweeping out carriers. It follows that the maximum reverse recovery current is increased.

In the high breakdown voltage semiconductor device according to each of the first, second and third embodiments of the present invention, each of the first and second electrodes can be formed of Al, Au, Cu, etc.

Figure 2A:
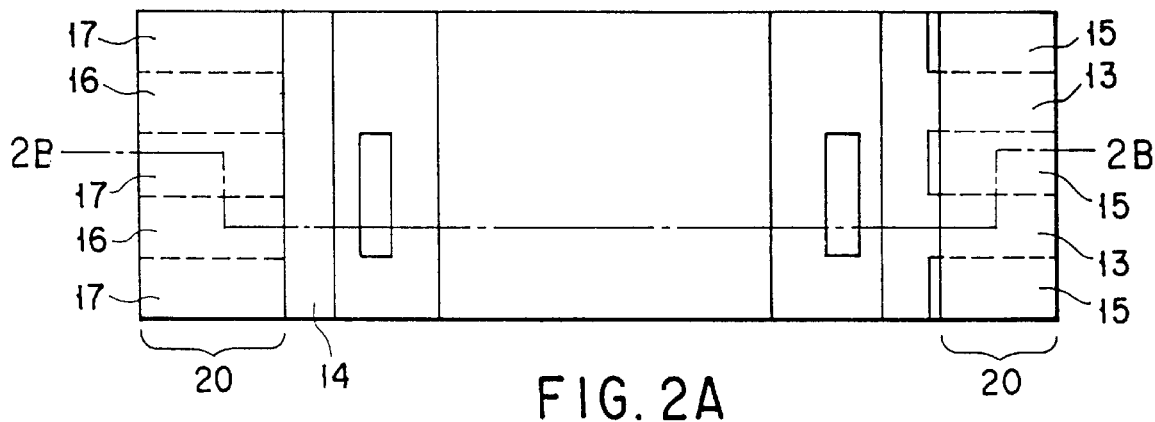
FIG. 2A is a plan view showing a lateral diode according to one embodiment of the present invention.
Figure 2B:
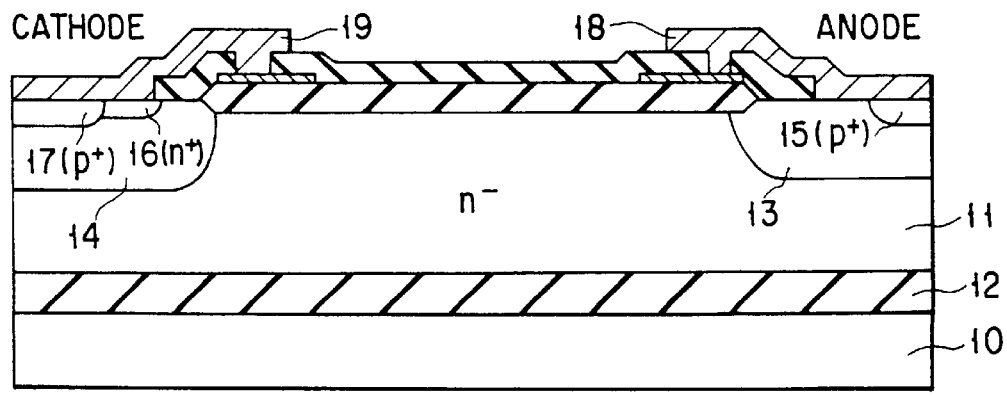
FIG. 2B is a cross sectional view along line 2B—2B shown in FIG. 2A.
Figure 4A:
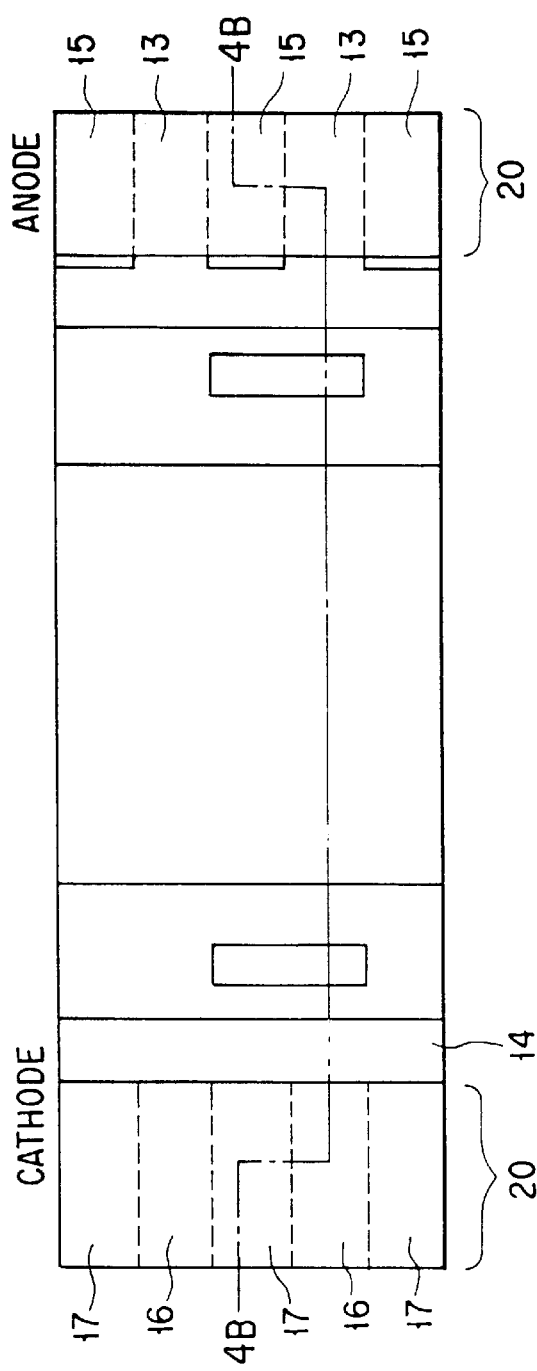
FIG. 4A is a plan view showing a lateral diode according to another modification of the present invention.
Figure 4B:
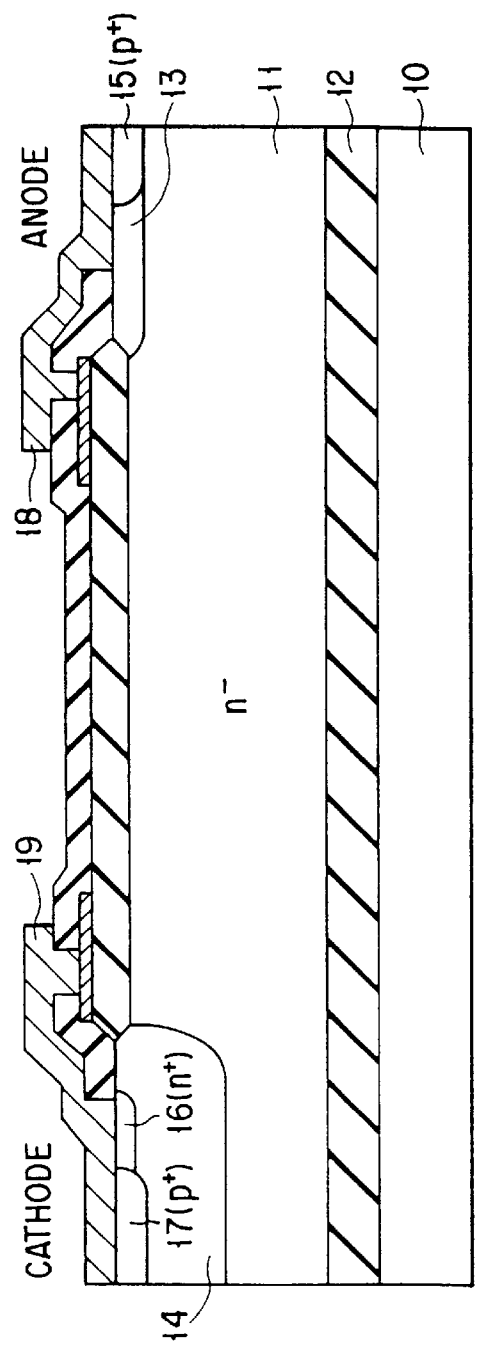
FIG. 4B is a cross sectional view along line 4B—4B shown in FIG. 4A.

Let us describe various embodiments of the present invention with reference to the accompanying drawings. Specifically, FIG. 2A is a plan view showing a lateral diode according to the first embodiment of the present invention, with FIG. 2B showing a cross section along line 2B—2B shown in FIG. 2A. As shown in the drawings, a dielectric isolation type substrate is prepared by forming a high resistivity n⁻-type semiconductor substrate 11 on a semiconductor substrate 10 with an insulating layer 12 interposed therebetween. A p-type anode region 13 and an n-type cathode region 14 are formed in surface regions of the n-type semiconductor substrate 11 included in the dielectric isolation type substrate. A plurality of p⁺-type impurity regions 15 are selectively formed within the anode region 13. Further, a plurality of n⁺-type impurity regions 16 and a plurality of p⁺-type impurity regions 17 are formed in the n-type cathode region 14.

As shown in FIG. 2A, the p⁺-type impurity regions 15 are formed in the anode region 13 in the form of strips positioned apart from each other. On the other hand, the n⁺-type impurity regions 16 and the p⁺-type impurity regions 17 are alternately formed within the cathode region 14 such that each n⁺-type impurity region 16 is sandwiched between two adjacent p⁺-type impurity regions 17.

An anode electrode 18 is formed in contact with the surface of the p⁺-type impurity region 15. The anode electrode 18 is in Schottky contact with the anode region 13 and in ohmic contact with the p⁺-type impurity region 15. On the other hand, a cathode electrode 19 is formed is ohmic contact with each of the n⁺-type impurity region 16 and the p⁺-type impurity region 17.

In the peripheral portion of the device, the anode electrode 18 extends to reach an edge of the p⁺-type impurity region 15 so as to be in contact with the anode region 13 and with the p⁺-type impurity region 15. On the other hand, the cathode electrode 18 extends to reach an edge of the p⁺-type impurity region 17 so as to be in contact with the n⁺-type impurity region 16 and the p⁺-type impurity region 17.

One of two reference numerals 20 shown in FIG. 2A represents a contact hole for bringing the cathode electrode 19 into contact with the n⁺-type impurity region 16 and with the p⁺-type impurity region 17. The other reference numeral 20 represents a contact hole for bringing the anode electrode 18 into contact with the anode region 13 and with the p⁺-type impurity region 15.

FIG. 2B seemingly indicates that the n⁺-type impurity region 16 is positioned in series with the p⁺-type impurity region 17. However, these n⁺-type and p⁺-type impurity regions 16 and 17 are positioned in parallel such that the p⁺-type impurity region 17 is in direct contact with the surface region of the n-type cathode region 14, as shown in FIG. 2A. The particular construction is one of the features of the lateral diode of the present invention.

Incidentally, in the lateral diode shown in FIGS. 2A and 2B, the n⁻-type semiconductor substrate 11 having a high resistivity has a thickness of 15 $\mu$m, the insulating film 12 has a thickness of 3 $\mu$m, and the p-type anode region 13 has an impurity concentration in the surface region of $5.3 \times 10^{16}$ to $4.1 \times 10^{18}$ cm$^{-3}$ and a diffusion depth of 0.68 to 6.3 $\mu$m.

FIGS. 3A to 5B are plan views and cross sectional views showing lateral diodes prepared by modifying the lateral diode shown in FIGS. 2A and 2B. The lateral diode shown in FIGS. 3A and 3B is substantially equal to the lateral diode shown in FIGS. 2A and 2B, except that, in the lateral diode shown in FIGS. 3A and 3B, the diffusion depth of the anode region 13 is smaller than in the lateral diode shown in FIGS. 2A and 2B, and the impurity concentration in the surface region of the anode region 13 is higher than in the lateral diode shown in FIGS. 2A and 2B. The lateral diode shown in FIGS. 4A and 4B is also substantially equal to the lateral diode shown in FIGS. 3A and 3B, except that, in the lateral diode shown in FIGS. 4A and 4B, the diffusion depth of the anode region 13 is smaller than in the lateral diode shown in FIGS. 3A and 3B, and the impurity concentration in the surface region of the anode region 13 is higher than in the lateral diode shown in FIGS. 3A and 3B.

Further, the lateral diode shown in FIGS. 5A and 5B is substantially equal to the lateral diode shown in FIGS. 2A and 2B, except that, in the lateral diode shown in FIGS. 5A and 5B, the p⁺-type impurity regions 15 are arranged at a pitch smaller than that on the cathode side. Specifically, the width of the p⁺-type impurity region 15 as viewed from above is 2.5 $\mu$m in the lateral diode shown in FIGS. 5A and 5B in contrast to 10 $\mu$m in the lateral diode shown in FIGS. 2A and 2B.

Figure 6:
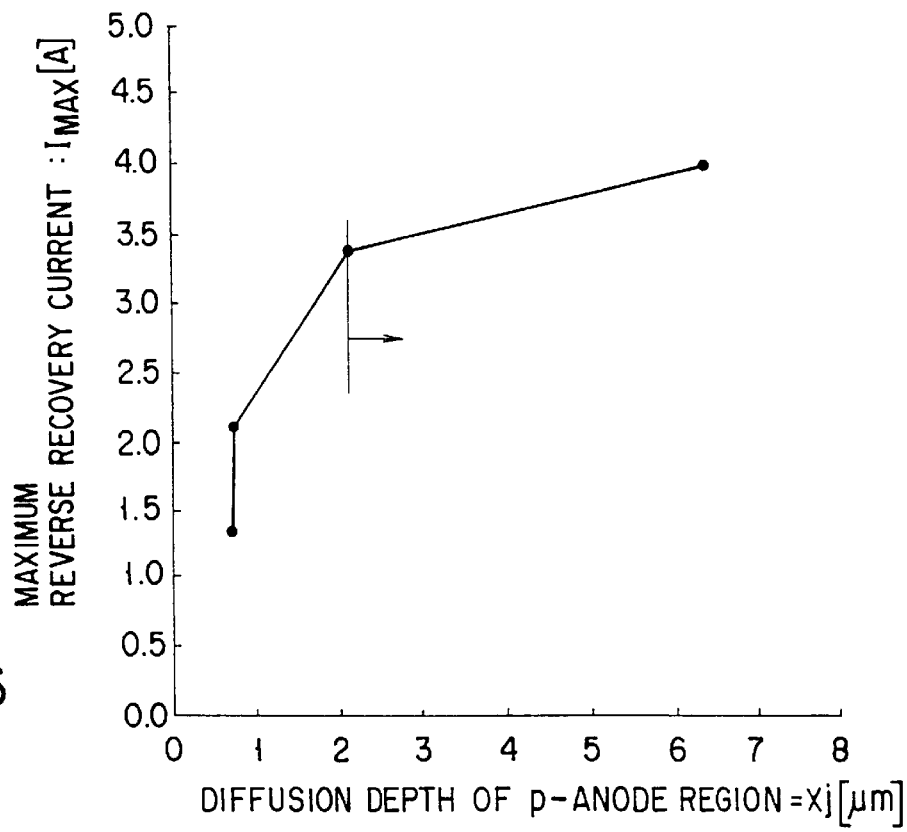
FIG. 6 is a graph showing the relationship between the $I_{MAX}$ and the diffusion depth of the p-type anode region of the lateral diode shown in FIGS. 2A and 2B.

FIG. 6 is a graph showing the relationship between the maximum reverse recovery current $I_{MAX}$ and the impurity diffusion depth of the p-type anode region 13 in respect of the lateral diode shown in FIGS. 2A and 2B. It is clearly seen from the graph of FIG. 6 that the maximum reverse recovery current $I_{MAX}$ of 3A or more can be obtained where the impurity diffusion depth of the p-type anode region 13 is 2 $\mu$m or more.

Figure 7:
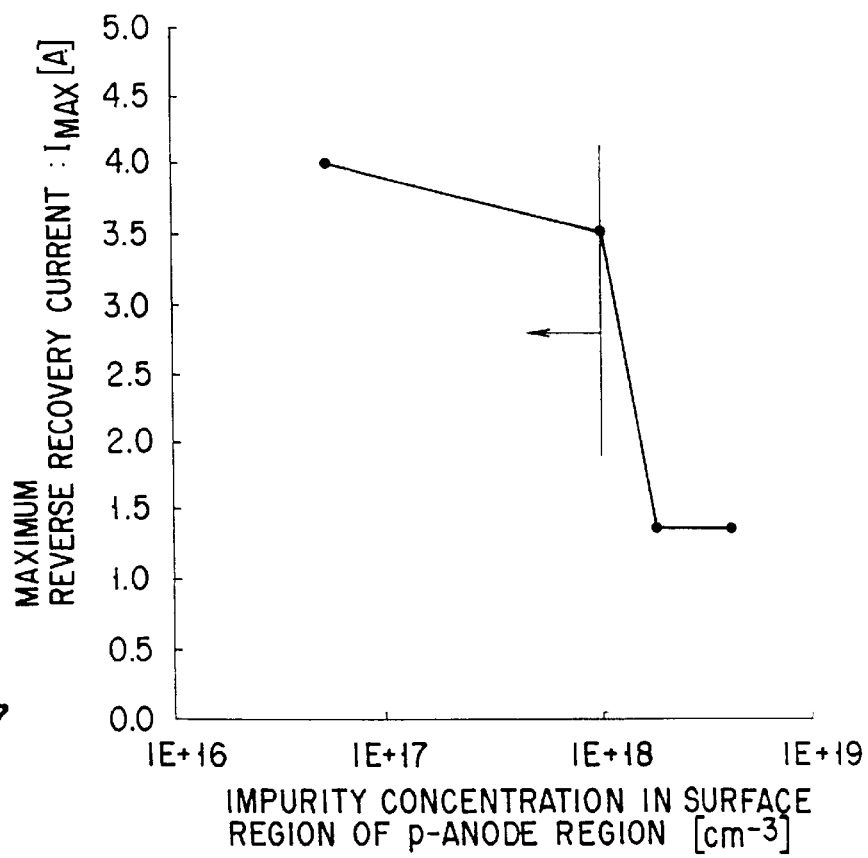
FIG. 7 is a graph showing the relationship between the $I_{MAX}$ and the impurity concentration in a surface of the p-type anode region of the lateral diode shown in FIGS. 2A and 2B.

FIG. 7 is a graph showing the relationship between the maximum reverse recovery current $I_{MAX}$ and the impurity concentration in the surface region of the p-type anode region 13 in respect of the lateral diode shown in FIGS. 2A and 2B. It is clearly seen from the graph of FIG. 7 that the maximum reverse recovery current $I_{MAX}$ of 3A or more can be obtained where the impurity concentration in the surface region of the p-type anode region 13 is not higher than $1.0 \times 10^{18}$ cm$^{-3}$.

As apparent from FIGS. 6 and 7, the maximum reverse recovery current $I_{MAX}$ of 3A or more can be obtained by setting the impurity concentration in the surface region of the p-type anode region 13 at $1.0 \times 10^{18}$ cm$^{-3}$ or lower or by setting the impurity diffusion depth of the p-type anode region 13 at 2 μm or less. Of course, it is possible to set the impurity diffusion depth and the impurity concentration to meet the above-noted conditions simultaneously.

Figure 8:
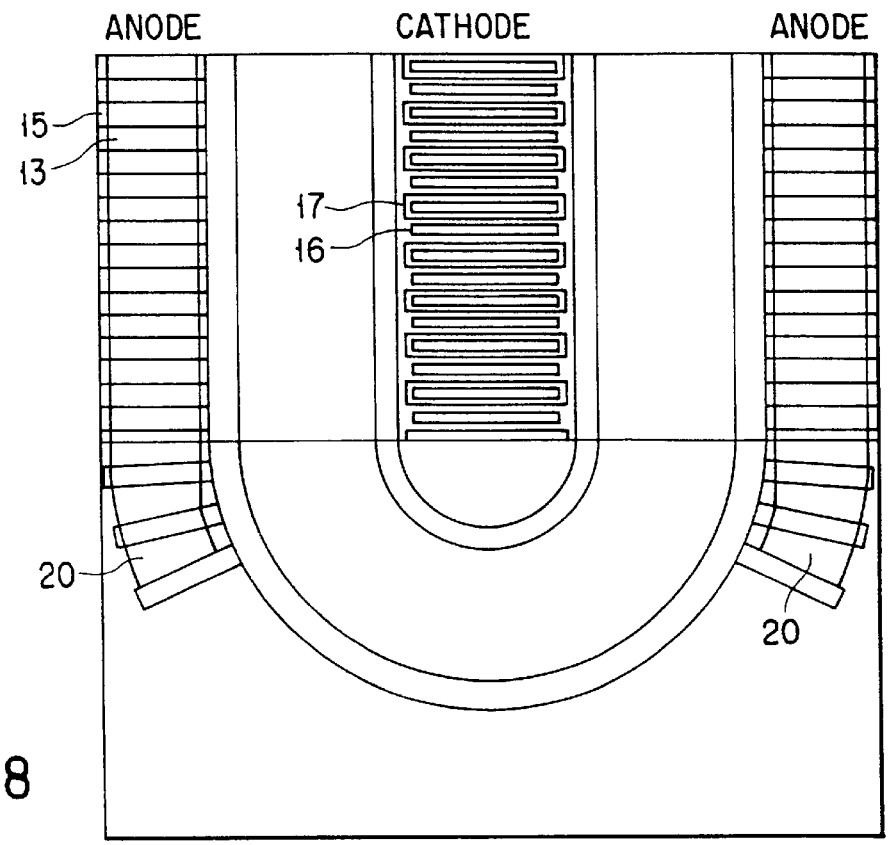
FIG. 8 is a plan view showing a peripheral portion of a lateral diode according to a comparative example.

Let us describe the construction at the end portion of the lateral diode. Specifically, FIG. 8 is a plan view showing the peripheral portion of the lateral diode according to a comparative example of the present invention. In this case, the p$^+$-type regions 15 on the side of the anode are formed apart from each other to present a striped pattern in the p-type region 13. In other words, the p-type region 13 seems to be divided, when viewed from above, by these p$^+$-type regions 13 into a plurality of small sections. The striped pattern of the p$^+$-type regions 15 extends to cover partly a curved portion of the anode. Further, a contact hole 20 is formed above the p$^+$-type regions 13 and the p-type region 13. Also, p$^+$-type regions 17 on the side of the cathode are formed within the n$^+$-type region 16 and are not formed in a curved portion of the cathode. Further, a contact hole is not formed in the curved portion.

As described previously, carriers are likely to be accumulated in the end portion in the lateral diode of the construction shown in FIG. 8. As a result, impact ionization takes place even under an intermediate voltage in injecting carriers in a high concentration, making it difficult to obtain a high breakdown voltage semiconductor device.

Figure 9:
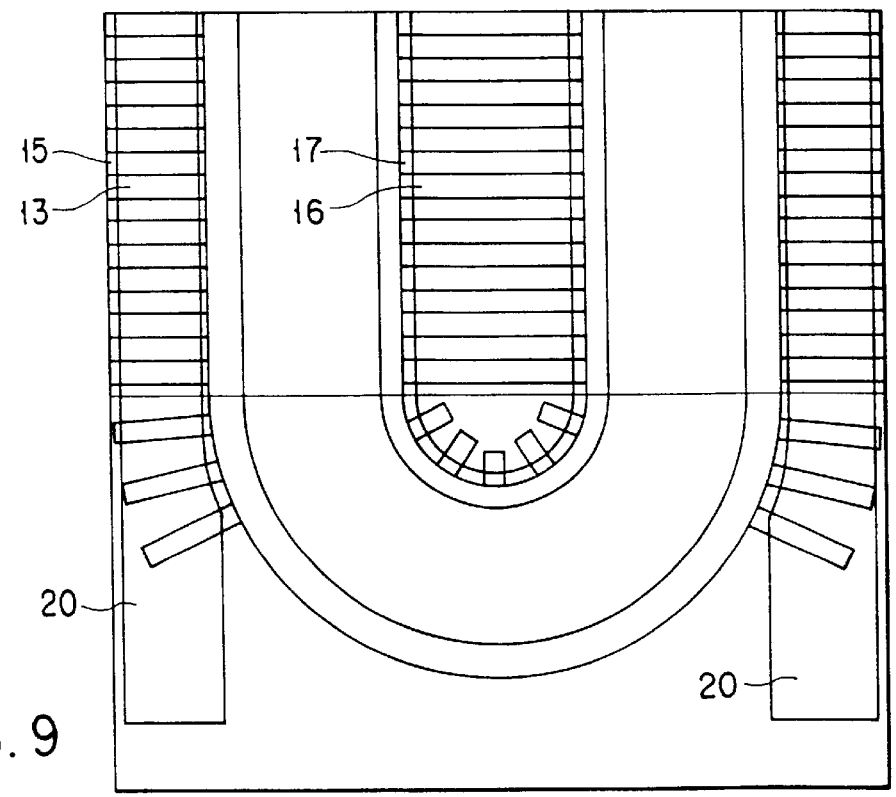
FIG. 9 is a plan view showing a peripheral portion of a lateral diode according to another modification of the present invention.

FIG. 9 is a plan view showing the peripheral portion of a lateral diode according to another modification of the present invention. The lateral diode shown in FIG. 9 permits overcoming the problems inherent in the lateral diode of the construction shown in FIG. 8. It should be noted that the lateral diode shown in FIG. 9 is constructed to permit the carriers accumulated in the end portion to be swept out. To be more specific, the p$^+$-type regions 15 on the anode side are formed apart from each other to present a striped pattern within the p-type region 13, and the striped pattern extends to cover partly a curved portion. Also, the contact hole 20 is formed to cover a large area of the p-type region 13. Further, the p$^+$-type regions 17 on the side of the cathode are formed apart from each other to present a striped pattern within the n$^+$-type region 16. In this case, the striped pattern of the p$^+$-type regions 17 is formed to cover the entire region of the curved portion so as to suppress the carrier injection.

Figure 10:
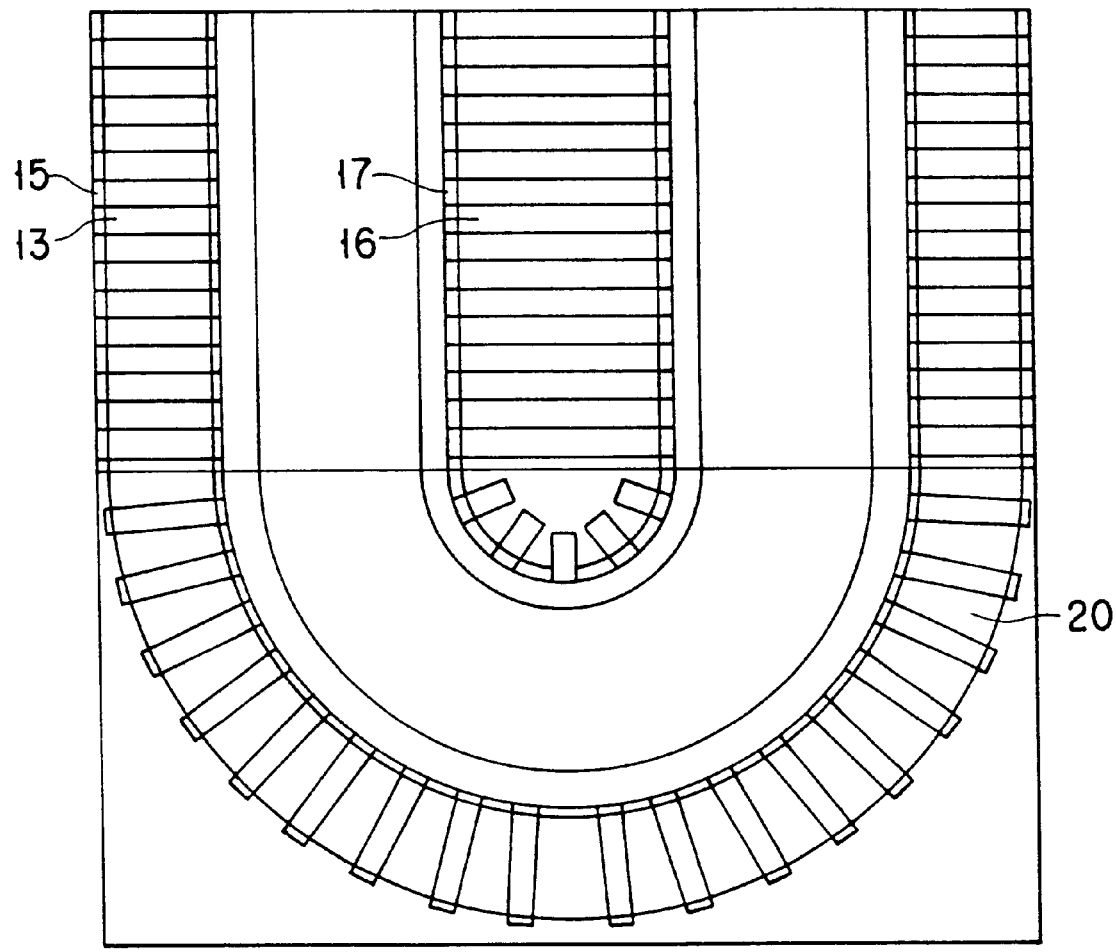
FIG. 10 is a plan view showing a peripheral portion of a lateral diode according to another modification of the present invention.

FIG. 10 is a plan view showing the peripheral portion of a lateral diode according to another modification of the present invention. In this modification, the p$^+$-type regions 15 are formed apart from each other to present a striped pattern within the p-type region 13. The particular striped pattern extends to cover the entire curved portion on the side of the anode. Also, a contact hole 20 is formed to cover the entire curved portion on the side of the anode.

Figure 11:
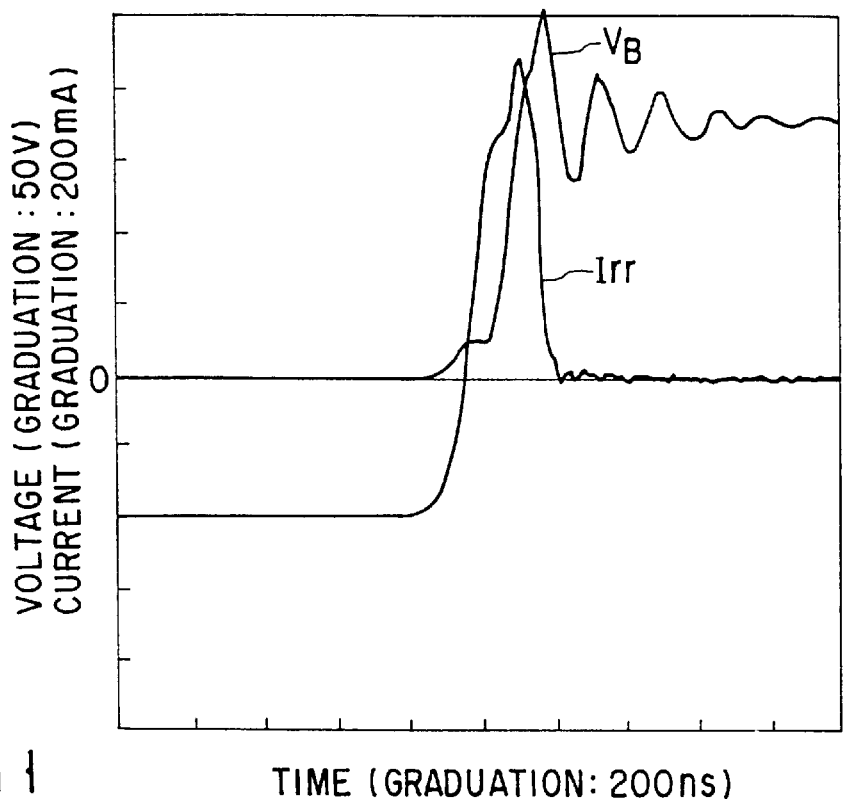
FIG. 11 is a graph showing a maximum reverse recovery current waveform of the lateral diode constructed as shown in FIG. 8.
Figure 12:
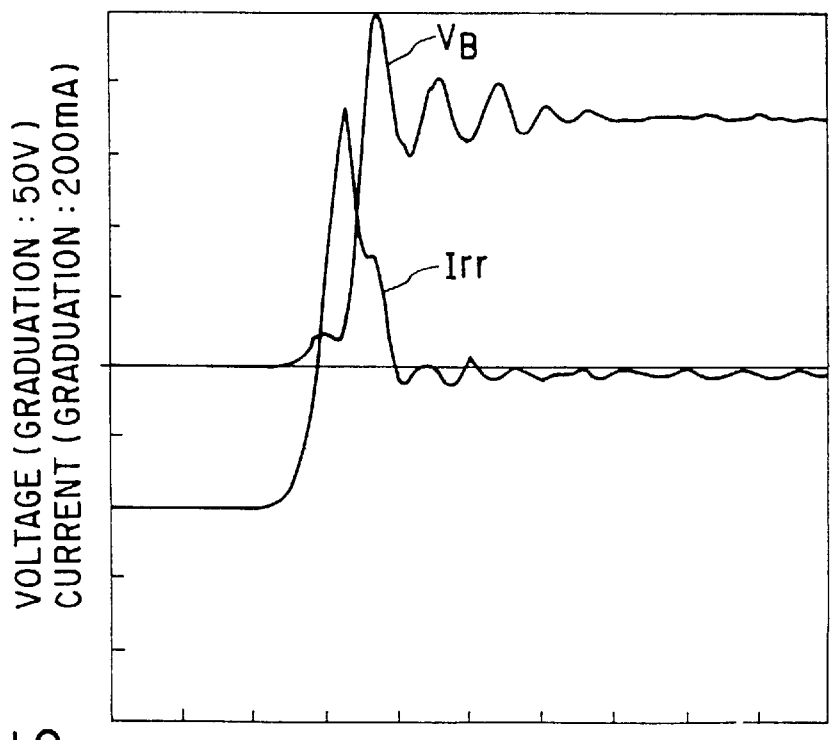
FIG. 12 is a graph showing a maximum reverse recovery current waveform of the lateral diode constructed as shown in FIG. 9.

FIG. 11 is a graph showing a maximum reverse recovery current waveform of a lateral diode constructed as shown in FIG. 8, with FIG. 12 showing a maximum reverse recovery current waveform of a lateral diode constructed as shown in FIG. 9. FIG. 12 shows that $t_{rr}$ was 220 nsec and $Q_{rr}$ was 7.5×10$^{-8}$ A·sec, denoting reduction by 12% and 32%, respectively. Further, the lateral diode of the construction shown in FIG. 9 was found to exhibit a breakdown voltage of 500 V or more.

Figure 13:
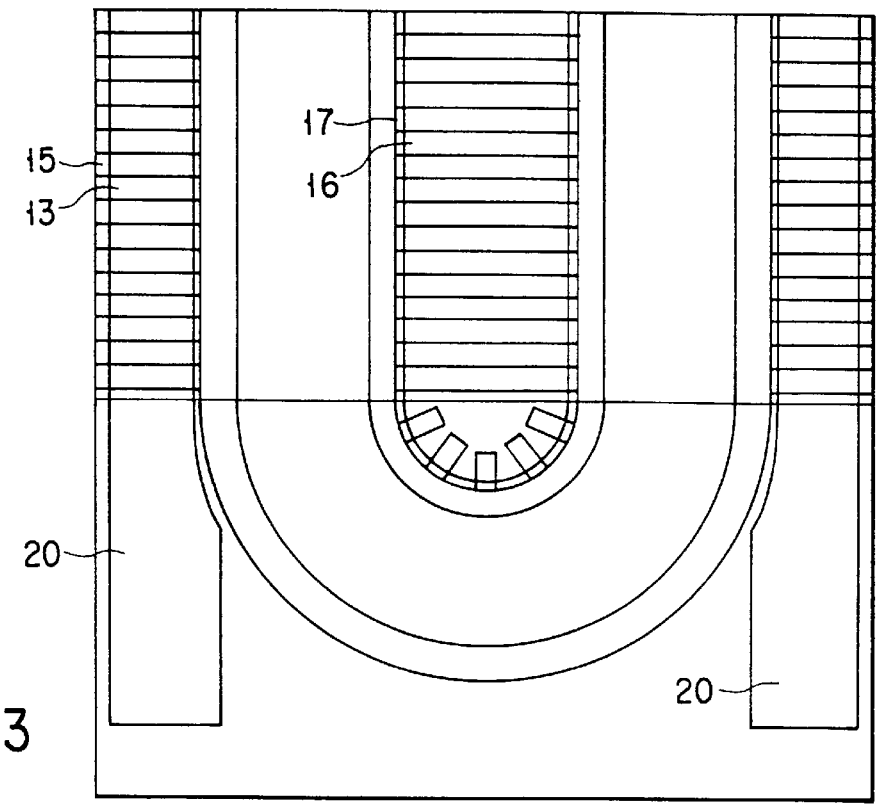
FIG. 13 is a plan view showing a peripheral portion of a lateral diode according to another modification of the present invention.

FIG. 13 is a plan view showing the peripheral portion of a lateral diode according to another modification of the present invention. In this modification, the p$^+$-type regions 15 are not formed in the curved portion on the side of the anode. The lateral diode of the construction shown in FIG. 13 permits sweeping carriers in a larger amount, compared with the lateral diode of the construction shown in FIG. 8.

Figure 14:
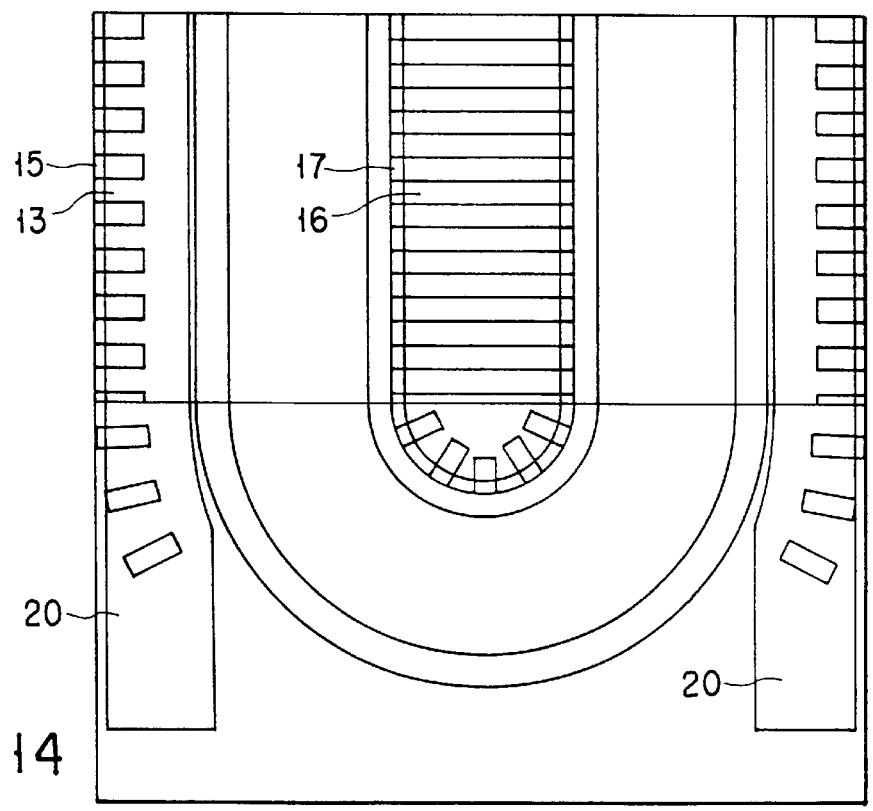
FIG. 14 is a plan view showing a peripheral portion of a lateral diode according to another modification of the present invention.

FIG. 14 is a plan view showing the peripheral portion of a lateral diode according to another modification of the present invention. In this modification, the p$^+$-type regions 15 are formed on the outer region alone of the p-type region 13 so as to widen the p-type region 13.

Figure 15:
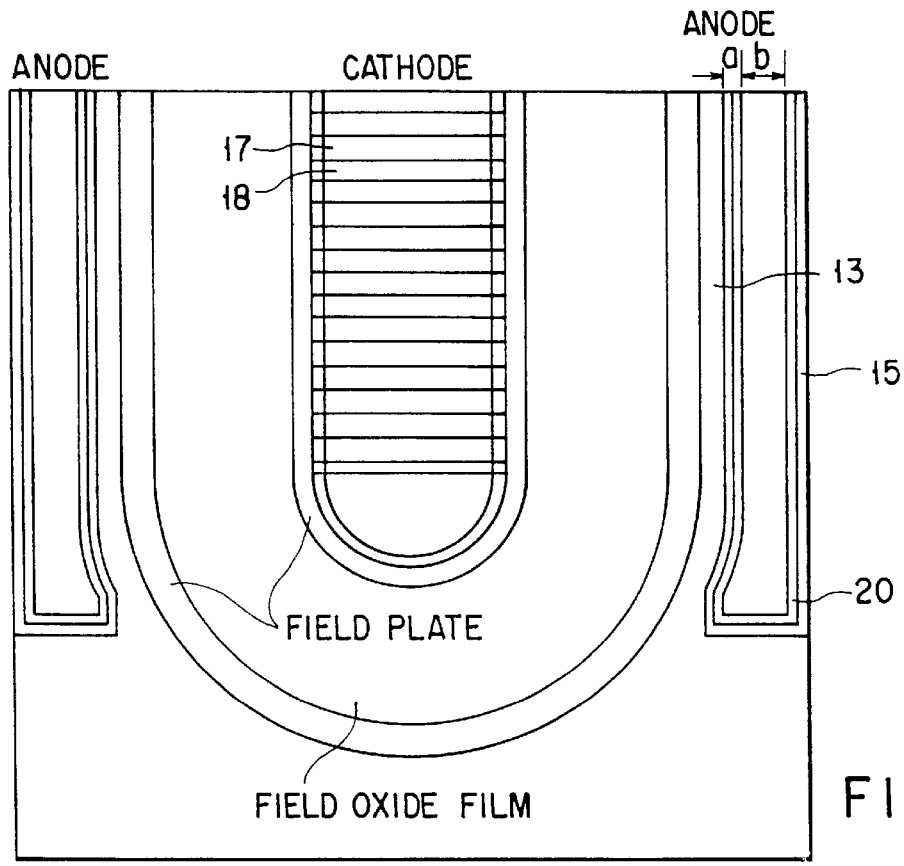
FIG. 15 is a plan view showing a peripheral portion of a lateral diode according to another modification of the present invention.

FIG. 15 is a plan view showing the peripheral portion of a lateral diode according to another modification of the present invention. In this modification, the p$^+$-type region 15 is formed in the shape of a frame within the p-type region 13. Sizes a and b shown in FIG. 15 can be set as follows:

a=4 μm; b=10 μm
a=8 μm; b=10 μm
a=4 μm; b=14 μm

Further, the contact length can be set at 14 μm or 18 μm.

The lateral diode of the particular construction produces the effect that p$^+$ carriers are injected in a contact frame like manner to prevent a depletion at an edge portion of contact, and thus improving a maximum reverse recovery current.

Figure 16:
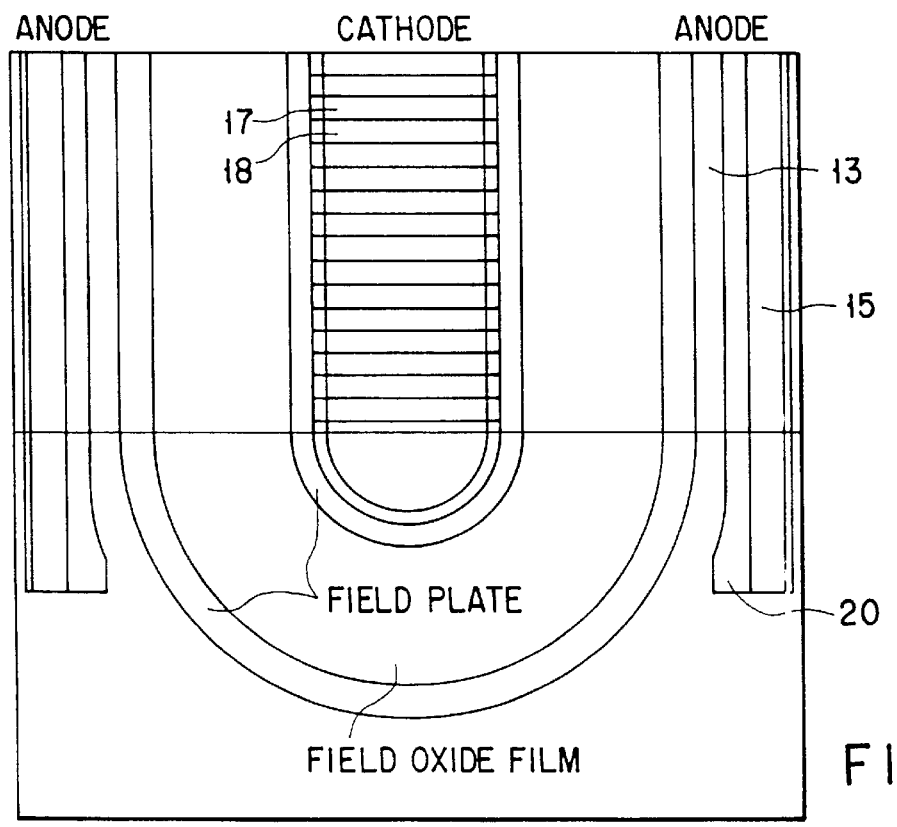
FIG. 16 is a plan view showing a peripheral portion of a lateral diode according to another modification of the present invention.

FIG. 16 is a plan view showing the peripheral portion of a lateral diode according to another modification of the present invention. In this modification, the p$^+$-type region 15 is formed to extend as a linear member within the p-type region 13.

Figure 17:
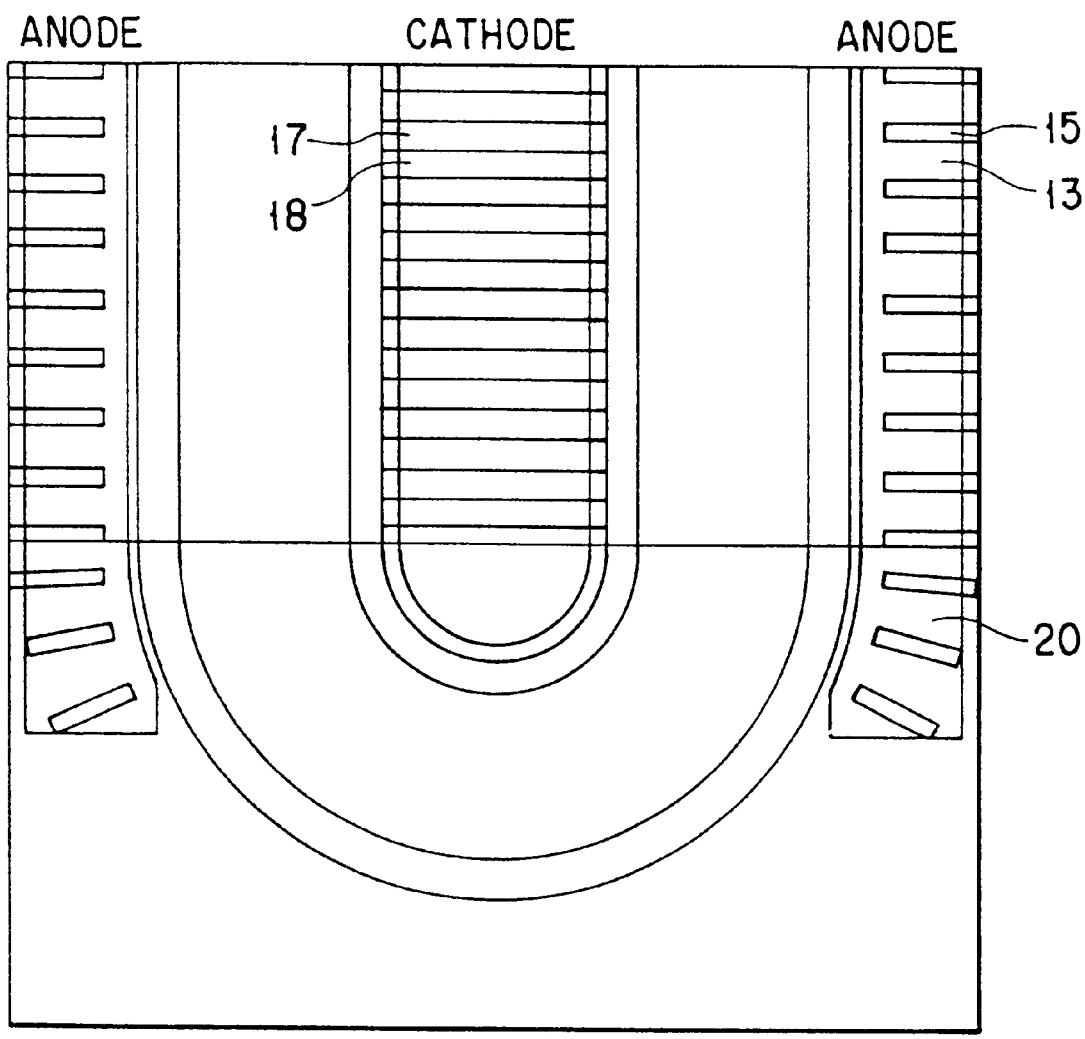
FIG. 17 is a plan view showing a peripheral portion of a lateral diode according to another modification of the present invention.

FIG. 17 is a plan view showing the peripheral portion of a lateral diode according to another modification of the present invention. The construction shown in FIG. 17 is substantially equal to that shown in FIG. 9, except that, in the modification shown in FIG. 17, the area of p$^+$-type region 17 is not formed in a curved portion at the periphery of the cathode.

Figure 18A:
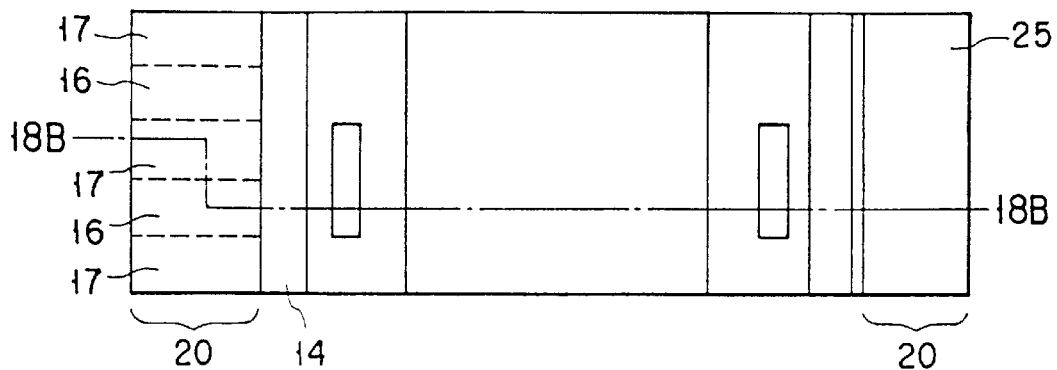
FIG. 18A is a plan view showing a lateral diode according to a second embodiment of the present invention.
Figure 18B:
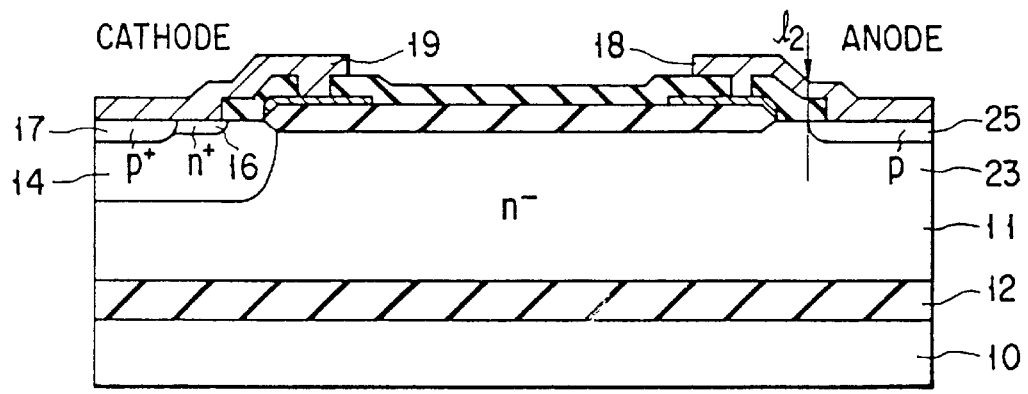
FIG. 18B is a cross sectional view along 18B—18B shown in FIG. 18A.

FIG. 18A is a plan view showing an SOI lateral diode according to a second embodiment of the present invention. FIG. 18B is a cross sectional view along the line 18B—18B shown in FIG. 18A. The lateral diode of the second embodiment is equal to that of the first embodiment in the cathode region, but differs from the lateral diode of the first embodiment in the anode region. Specifically, the impurity concentration in a p-type region 25 is set at a value at which the p-type region 25 is in transition contact, which is intermediate between the ohmic contact and the Schottky contact, with the metal electrode. The particular impurity concentration exceeds, for example, 1.0×10$^{18}$ cm$^{-3}$ and is lower than 1.0×10$^{19}$ cm$^{-3}$. Further, the interlayer insulating film positioned between the p-type layer 25 on the anode side and the field plate has a thickness $l_2$ of 1 μm, which is relatively thick.

Figure 18C:
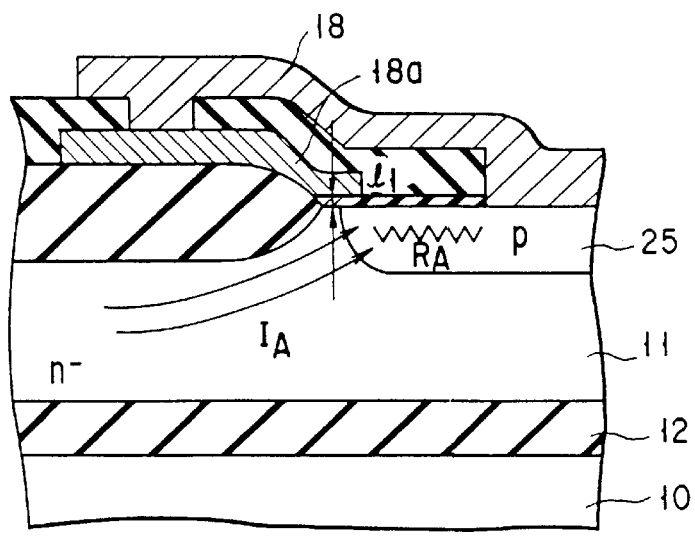
FIG. 18C is a cross sectional view of an anode portion of the lateral diode shown in FIG. 18A.

Let us describe the problems inherent in the conventional lateral diode, particularly, SOI lateral diode, before description of the function and effect produced by the lateral diode of the construction employed in the second embodiment of the present invention. Specifically, where the p-type region 25 in the anode region is formed shallow (1.5 μm or less, typically 1.0 μm or less) in the lateral diode, particularly, SOI lateral diode, current IA flowing into the anode is concentrated on the surface of the n-type semiconductor substrate 11 so as to flow through a resistance $R_A$ present inside the p-type region 25, as shown in FIG. 18C. As a result, a serious problem is generated. Specifically, the present inventors have found that a high voltage is applied between the surface of the n-type semiconductor substrate 11 and the field plate electrode 18a connected to the anode electrode 18 because of the voltage drop caused by the resistance $R_A$, with the result that an insulation breakdown is brought about in a thin insulating film having a thickness $l_1$ and interposed between the n-type semiconductor substrate 11 and the field plate electrode 18a.

Figure 19:
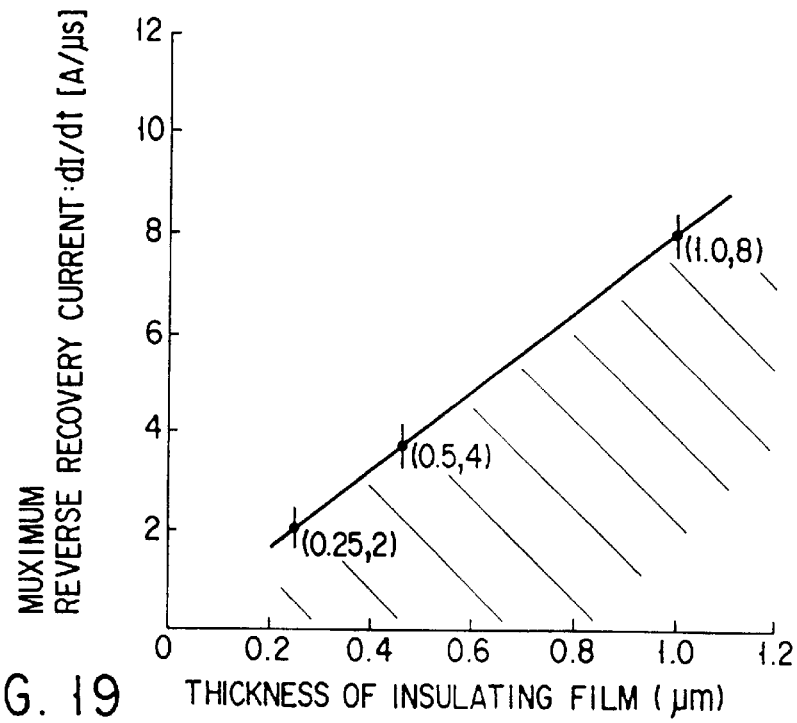
FIG. 19 is a graph showing the relationship between $I_{max}$ and the thickness of the insulation film formed on the pn junction portion.

In the lateral diode according to the second embodiment of the present invention, the p-type impurity concentration of the p-type region 25 is set at a low level falling within a transition range, making it possible to suppress the hole injection from the p-type region in the anode. It should also be noted that the insulating film positioned above the pn junction portion has a large thickness, making it possible to moderate the electric field generated by the concentration of the current $I_A$ in the surface region in the step of sweeping out carriers. It follows that it is possible to increase the maximum reverse recovery current. FIG. 19 is a graph showing the relationship between the thickness of the insulating film above the pn junction portion and the maximum reverse recovery current/unit time. As apparent from the graph, the maximum reverse recovery current is increased with increase in the thickness of the insulating film. In the region denoted by shading, insulation breakdown does not take place so as to achieve a high performance.

Figure 20A:
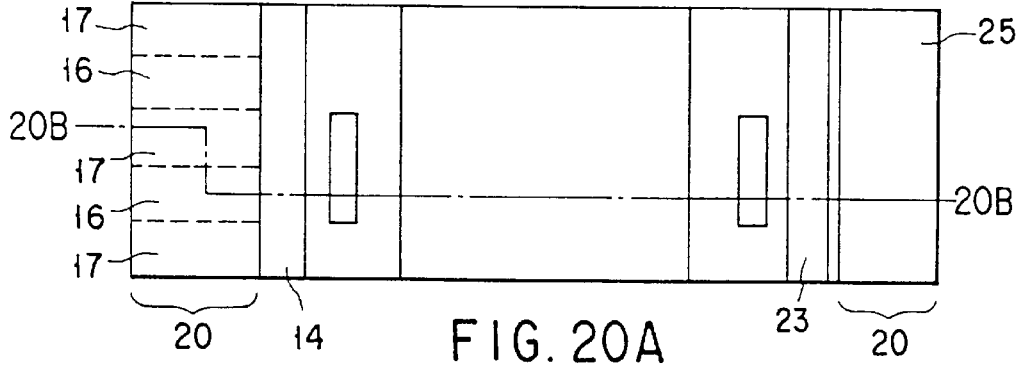
FIG. 20A is a plan view showing a lateral diode according to a third embodiment of the present invention.
Figure 20B:
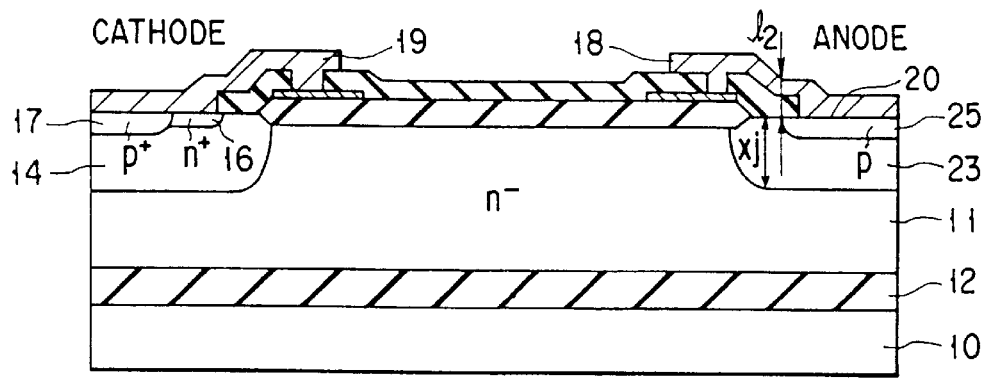
FIG. 20B is a cross sectional view along line 20B—20B shown in FIG. 20A.

FIG. 20A is a plan view showing an SOI lateral diode according to a third embodiment of the present invention. FIG. 20B is a cross sectional view along the line 20B—20B shown in FIG. 20A. The lateral diode of the third embodiment is equal to that of the first embodiment in the cathode region, but differs from the lateral diode of the first embodiment in the anode region. In the third embodiment, the anode region consists of a p-type region 25 having an impurity concentration to permit the p-type region 25 to be in transition contact, which is intermediate between the ohmic contact and the Schottky contact, with the metal electrode, and another p-type region 23 having a surface impurity concentration of $1.0 \times 10^{18}$ cm$^{-3}$ or less and a diffusion depth $X_j$ of at least 2 μm.

In the lateral diode according to the third embodiment of the present invention, the p-type impurity concentration of the p-type region 25 is set at a low level falling within a transition range, making it possible to suppress the hole injection from the p-type region in the anode. It should also be noted that the p-type layer is diffused deep, making it possible to prevent current $I_A$ from being concentrated in the surface region in the step of sweeping out carriers. It follows that the maximum reverse recovery current is increased.

Figure 21:
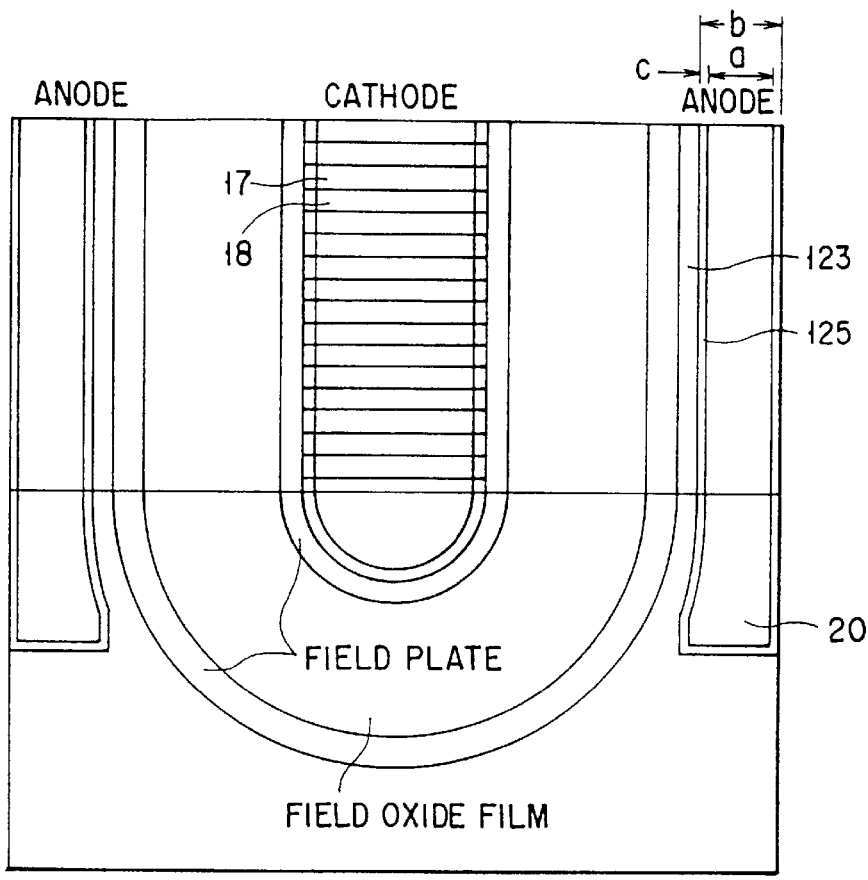
FIG. 21 is a plan view showing a peripheral portion of a lateral diode according to another modification of the present invention.

Further, FIG. 21 is a plan view showing the peripheral portion of a lateral diode according to another modification of the present invention. In this modification, the p$^+$-type region 25 is formed wide. Sizes a, b and c shown in FIG. 18 can be set as follows:

a=14 μm; b=20 μm; c=6 μm
a=14 μm; b=15 μm; c=1 μm
a=18 μm; b=20 μm; c=2 μm

Where sizes a, b and c were set at: a=18 μm; b=15 μm; and c=−3 μm, it was impossible to obtain satisfactory characteristics.

Figure 22:
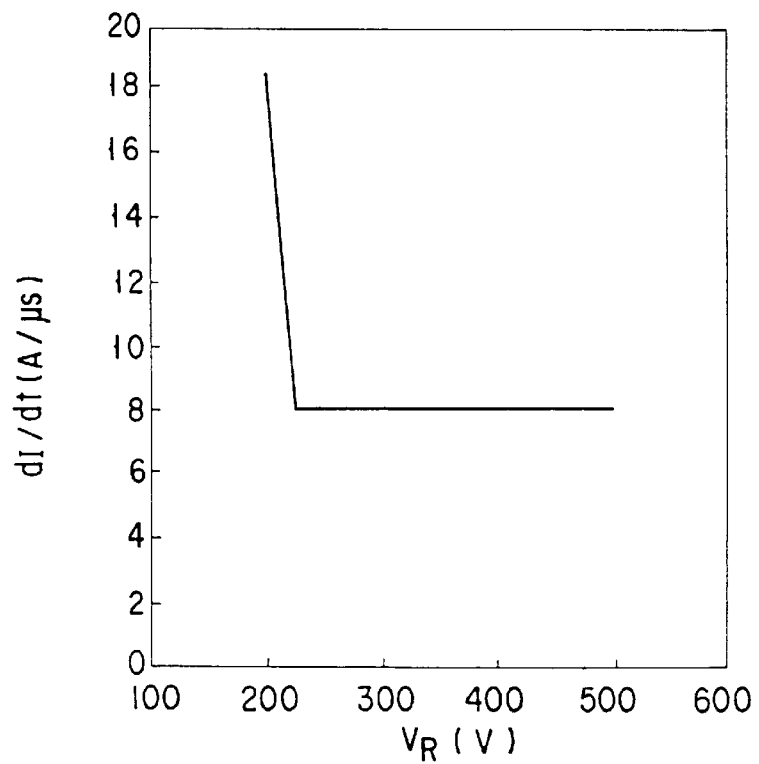
FIG. 22 is a graph showing the breakdown voltage characteristics of the lateral diode constructed as shown in FIGS. 2A, 18A and 20A.

FIG. 22 is a graph showing the breakdown characteristics of the lateral diode constructed as shown in FIGS. 2A, 2B, 18A, 18B, 20A and 20B. In the graph of FIG. 22, the applied reverse voltage $V_R$ is plotted on the abscissa, with the reverse restoring current per unit time, i.e., dI/dt (A/μs), being plotted on the ordinate. As apparent from the graph of FIG. 22, the maximum reverse recovery current per unit time is rendered constant, if the breakdown voltage exceeds 200 V.

Incidentally, where the breakdown voltage was 500 V, the impurity concentration of the active layer 11 was found to be $1 \times 10^{15}$ cm$^{-3}$. Also, the distance between the n-type region 14 and the p-type region 13 (23) was found to be 50 μm. Further, the thickness of the active layer 11 was found to be 15 μm.

As described above in detail, in the semiconductor device according to the first embodiment of the present invention, the p-type anode region 13 is brought into Schottky contact with the anode electrode, the impurity concentration in a surface region of the p-type anode region 13 is set at $1.0 \times 10^{18}$ cm$^{-3}$ or less, or the impurity diffusion depth of the p-type anode region 13 is set at 2 μm or more. The particular construction makes it possible to obtain a high breakdown voltage semiconductor device, said device using a dielectric isolation type substrate and having a high maximum reverse recovery current $I_{MAX}$ thereby to make the semiconductor device unlikely to be destroyed.

According to the second embodiment of the present invention, the p-type impurity concentration of the p-type region 25 is set at a low level falling within a transition range, making it possible to suppress the hole injection from the p-type region in the anode. It should also be noted that the insulating film positioned above the pn junction portion has a large thickness, making it possible to moderate the electric field generated by the concentration of the current $I_A$ in the surface region in the step of sweeping out carriers. It follows that it is possible to increase the maximum reverse recovery current.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A high breakdown voltage semiconductor device, comprising:

a semiconductor substrate;

an active layer consisting essentially of a high resistivity semiconductor layer of a first conductivity type formed on said substrate with an insulating layer interposed therebetween;

a first impurity region of the first conductivity type formed within said active layer;

a second impurity region of a second conductivity type formed within the active layer;

a third impurity region of the second conductivity type formed within said second impurity region and having an impurity concentration higher than that of the second impurity region;

a first electrode being in ohmic contact with said first impurity region; and a second electrode being in Schottky contact with the second impurity region and in ohmic contact with the third impurity region.

2. The semiconductor device according to claim 1, which further comprises a fourth impurity region of the first conductivity type formed within said first impurity region and having an impurity concentration higher than that of the first impurity region, a fifth impurity region of said second conductivity type formed within the first impurity region having an impurity concentration higher than that of the first impurity region.

3. The semiconductor device according to claim 2, wherein said fourth and fifth impurity regions are alternately arranged to form a radial configuration in a curved portion at an end portion of said first impurity region.

4. The semiconductor device according to claim 1, wherein said third impurity region is formed of a plurality of sub regions radially arranged a predetermined distance apart from each other.

5. The semiconductor device according to claim 1, wherein said second impurity region has an impurity diffusion depth of at least 2 μm.

6. The semiconductor device according to claim 2, wherein said fourth and fifth impurity regions are alternately arranged along a direction in which said first impurity region extends.

7. A high breakdown voltage semiconductor device, comprising:

a semiconductor substrate;

an active layer consisting essentially of a high resistivity semiconductor layer of a first conductivity type formed on said substrate with an insulating layer interposed therebetween;

a first impurity region of the first conductivity type formed within said active layer;

a second impurity region of a second conductivity type formed within the active layer;

a third impurity region of the second conductivity type formed within said second impurity region and having an impurity concentration higher than that in the second impurity region;

a first electrode being in contact with said first impurity region; and a second electrode being in contact with the second impurity region and the third impurity region, wherein an impurity concentration in a surface of said second impurity region is not higher than $1.0 \times 10^{18}$ cm$^{-3}$.

8. The semiconductor device according to claim 7, which further comprises a fourth impurity region of the second conductivity type formed within said first impurity region and having an impurity concentration higher than that in the first impurity region, a fifth impurity region of said second conductivity type formed within the first impurity region and having an impurity concentration higher than that in the first impurity region.

9. The semiconductor device according to claim 8, wherein said fourth and fifth impurity regions are radially arranged alternately in a curved portion at the end of said first impurity region.

10. The semiconductor device according to claim 7, wherein said third impurity region is formed of a plurality of sub regions radially arranged a predetermine distance apart from each other in the end portion of said second impurity region.

11. The semiconductor device according to claim 7, wherein said second impurity region has an impurity diffusion depth of at least 2 μm.

12. The semiconductor device according to claim 8, wherein said fourth and fifth impurity regions are alternately arranged along a direction in which said first impurity region extends.

13. A high breakdown voltage semiconductor device, comprising:

a semiconductor substrate;

an active layer consisting essentially of a high resistivity semiconductor layer of a first conductivity type formed on said substrate with an insulating layer interposed therebetween;

a first impurity region of the first conductivity type formed within said active layer;

a second impurity region of a second conductivity type formed within the active layer;

a first electrode being in contact with the first impurity region; and a second electrode being in contact with the second impurity region, wherein an impurity concentration in a surface of said second impurity region is higher than $1.0 \times 10^{18}$ cm$^{-3}$ and lower than $1.0 \times 10^{19}$ cm$^{-3}$.

14. The semiconductor device according to claim 13, further comprising an insulating layer formed between a part of said second impurity region and said second electrode, a thickness of said insulating layer being not less than 0.5 μm.

15. The semiconductor device according to claim 13, further comprising a third impurity region formed in said active layer so as to surround said second impurity region and having an impurity concentration lower than that in the second impurity region.

16. A high breakdown voltage semiconductor device, comprising:

a semiconductor substrate;

an active layer consisting essentially of a high resistivity semiconductor layer of a first conductivity type formed on said substrate with an insulating layer interposed therebetween;

a first impurity region of the first conductivity type formed within said active layer;

a second impurity region of a second conductivity type formed within the active layer;

a third impurity region of the second conductivity type formed within said second impurity region and having an impurity concentration higher than that in the second impurity region a first electrode being in contact with the first impurity region; and a second electrode being in contact with the second and third impurity regions, wherein an impurity concentration in a surface of said second impurity region is lower than that in the third impurity region, and an impurity concentration of said third impurity region is higher than $1.0 \times 10^{18}$ cm$^{-3}$ and lower than $1.0 \times 10^{19}$ cm$^{-3}$.

17. The semiconductor device according to claim 16, wherein said second impurity region has an impurity diffusion depth of at least 2 μm.

18. The semiconductor device according to claim 16, wherein an impurity concentration of said second impurity region is not higher than $1.0 \times 10^{18}$ cm$^{-3}$.

* * * * *